United States Patent
Cooper et al.

(10) Patent No.: US 7,037,559 B2
(45) Date of Patent: May 2, 2006

(54) IMMERSION PLATING AND PLATED STRUCTURES

(75) Inventors: Emanuel I. Cooper, Scarsdale, NY (US); Charles C. Goldsmith, Poughkeepsie, NY (US); Stephen Kilpatrick, Lagrangeville, NY (US); Carmen M. Mojica, Dorado, PR (US); Henry A. Nye, III, Brookfield, CT (US)

(73) Assignee: International Business Machines Corporation, Armonk, NY (US)

( * ) Notice: Subject to any disclaimer, the term of this patent is extended or adjusted under 35 U.S.C. 154(b) by 228 days.

(21) Appl. No.: 10/426,725

(22) Filed: May 1, 2003

(65) Prior Publication Data

US 2004/0219384 A1 Nov. 4, 2004

(51) Int. Cl.
  *C25D 3/54* (2006.01)
  *C22C 12/00* (2006.01)
  *B05D 1/18* (2006.01)
  *B05D 7/17* (2006.01)
  *B05D 7/21* (2006.01)

(52) U.S. Cl. .................... 427/437; 427/443.1; 420/562; 420/557; 428/615; 428/646; 428/620; 428/936

(58) Field of Classification Search ................ 427/437, 427/443.1, 97.9, 99.5; 420/562, 557, 590; 428/615, 646, 620, 936; 205/225, 228, 238, 205/261, 302
See application file for complete search history.

(56) References Cited

U.S. PATENT DOCUMENTS

| | | | | |
|---|---|---|---|---|
| 5,160,422 A | * | 11/1992 | Nishimura et al. | 205/254 |
| 5,196,053 A | * | 3/1993 | Dodd et al. | 205/85 |
| 5,435,838 A | * | 7/1995 | Melton et al. | 106/1.22 |
| 5,554,211 A | * | 9/1996 | Bokisa et al. | 106/1.22 |
| 5,631,091 A | * | 5/1997 | Piano | 428/469 |
| 5,813,870 A | | 9/1998 | Gaynes et al. | |
| 5,876,795 A | * | 3/1999 | Goldsmith et al. | 427/226 |
| 6,063,172 A | * | 5/2000 | Bokisa et al. | 428/577 |
| 6,090,493 A | * | 7/2000 | Piano | 428/469 |
| 6,300,164 B1 | | 10/2001 | Call et al. | |
| 6,433,425 B1 | | 8/2002 | Sarkhel | |
| 6,447,980 B1 | | 9/2002 | Rahman et al. | |
| 6,465,161 B1 | | 10/2002 | Kang et al. | |
| 6,478,944 B1 | | 11/2002 | Ishiyama | |
| 6,680,128 B1 | * | 1/2004 | Mei | 428/570 |

OTHER PUBLICATIONS

"Lead–Free Tim Alloys–Laboratory Curiosities or Capable Processes?" by Manfred Jordan, Metal Finishing, Jan. 2003.
"Modern Aspects of Electrochemistry No. 35", edited by Brian E. Conway and Ralph E. White, chapter 2, "Electroless Deposition of Metals and Alloys", Djokic, pp. 51, 54, 55, 116–119.
"Electroplating" by Frederick Adolph Lowenheim, 1978, chapter 18, pp. 410–415.
"Tin Pest in Lead–Free Solders", Karlya et al., Soldering & Surface Mount Technology, 13/1, 2000, pp. 39–40.

* cited by examiner

*Primary Examiner*—John J. Zimmerman
*Assistant Examiner*—Jason L Savage
(74) *Attorney, Agent, or Firm*—Connolly, Bove, Lodge & Hutz, LLP; Robert M. Trepp

(57) ABSTRACT

A first metal is plated onto a substrate comprising a second metal by immersing the substrate into a bath comprising a compound of the first metal and an organic diluent. The second metal is more electropositive than the first metal. The organic diluent has a boiling point higher than a eutectic point in a phase diagram of the first and second metals. The bath is operated above the eutectic point but below the melting point of the second metal. For example, bismuth is immersion plated onto lead-free tin-based solder balls, and subsequently redistributed by fluxless reflow. Plated structures are also provided.

41 Claims, No Drawings

IMMERSION PLATING AND PLATED STRUCTURES

TECHNICAL FIELD

The present invention relates to immersion plating to initially create a liquid alloy, which in turn solidifies to form a tenacious deposit on a substrate. As a particular example, the present invention relates to plating bismuth onto a substrate and especially to provide a tenacious deposit of the bismuth on the substrate. The present invention is of special importance in providing tin-bismuth solders that are useful in electronic packaging.

BACKGROUND OF THE INVENTION

In electronic packaging, a chip carrier is typically coupled to a circuit card by a solder interconnect structure that includes a grid array such as a ball grid array (BGA) or a column grid array (CGA). The solder interconnect structure traditionally contained lead. However, a need exists in the elections industry and elsewhere to eliminate the use of lead due to imminent environmental requirements in many countries. The result is a need to develop lead-free solders that can perform as well as the old lead-tin ones. The new alloys making their way into development and manufacturing are all tin-based, and in many cases alloyed with small amounts of copper, silver and/or bismuth.

One essential difference between the lead-free alloys and the lead-tin ones is that lead-free, tin-based alloys are susceptible to the formation of the so-called "tin pest". This is a phenomenon of very sluggish phase transformation, in which the room temperature beta-tin phase is converted, below 13° C., into alpha-tin. The transformation is accompanied by massive expansion and cracking, and eventually by crumbling. The transformation is extremely slow near 13° C., but it attains a maximum rate around –30° C. to –40° C., where it can be completed within days or weeks. Since it is controlled by nucleation, the process rate is quite unpredictable; however, it certainly constitutes a great risk to any electronic devise that may, over their lifetime, be stored or operated in cold environments. Some alloying metals, such as Bi, Pb and Sb (not Cu and Ag, however), are very effective at suppressing the beta-to-alpha transformation.

Plating is a major manufacturing method of producing C4-type solder balls. While alloy plating of lead-tin alloys is well developed, commercial use of lead-free alloys plating is still in its infancy. Tin alloy baths have exhibited substantial control and aging problems that became exacerbated as additional alloying components such as bismuth are added.

Adding bismuth in a separate step through a bismuth plating method has tended to lead to bismuth deposits that are powdery and very poorly adherent to tin alloys. Accordingly, bismuth deposit can be rinsed or blown away when the structure is removed from the plating bath during routine rinsing and drying operations.

Also, adding bismuth to the solder alloy in a separate plating step is an appealing way to overcome the difficulties of alloy plating. In particular, immersion plating is in principle a desirable process because it is faster, often easier to control, and less expensive process compared to electrodeposition, since many wafers can be processed in one batch and tooling is comparatively simple. However, immersion plating is self-limiting, which is a disadvantage when a relatively thick deposit is needed for the purpose of incorporation into a reflowed connector of specified composition. For example, see Djokic, Electroless Deposition of Metals, Chapter 2, pp 54–55. Modem Aspects of Electrochemistry, No. 35, Kluwer Academics, 2002, which discusses problems with prior immersion or displacement deposition. In particular, such states that the "displacement reaction stops immediately after the reduced metal (more positive metal) covers the surface of the immersed metal (more negative metal). Accordingly, the thickness of the deposited metal is always limited. The time of immersion is particularly critical for achieving a uniform coating layer. Very often, the adhesion of the deposited films is not as good as that of films prepared by electrodeposition or by autocatalytic deposition."

Furthermore, immersion plating often leads to dendritic growth and to porous deposits with mediocre adhesion. This specifically is the case with immersion plating of bismuth on tin out of aqueous acidified bismuth salt solutions. The resulting deposits are easily rubbed off and can even be partly detached by vigorous rinsing. More importantly, since bismuth is prone to hydrolysis in water, the large area of the porous deposit contains a substantial amount of hydroxide, which interferes with solder reflow.

SUMMARY OF THE INVENTION

The present invention addresses problems discussed above, and in particular makes possible attaining good or tenacious adhesion of a metal to a substrate such as bismuth to a tin surface.

In particular, the present invention relates to a process for plating a first metal onto a substrate which comprises a second metal. The second metal is more electropositive than the first metal. The process comprises immersing the substrate to be coated into a bath comprising a compound of the first metal and an organic diluent having a boiling point higher than the eutectic point in the phase diagram of the first and second metals. The phase diagram of the two metals contains at least one eutectic point that is substantially lower and preferably at least about 5° C. lower than the melting point of the second metal. The bath is at a temperature during the plating that is above said eutectic point, but below the melting point of the second metal.

In addition, the present invention relates to a process for plating bismuth onto a substrate which comprises immersing the substrate to be coated into a bath comprising a bismuth compound and an organic diluent having a boiling point greater than 150° C. and wherein the bath contains an acid in a molar excess of the molar concentration of Bi ($3^+$) in the bath. In addition, the bath is at a temperature that is above said eutectic temperature of an alloy(s) to be formed from a reaction of bismuth with the substrate.

Further aspects of the present invention are directed to alloys obtained by the above disclosed processes.

A still further aspect of the present invention is concerned with a tin-containing solder having a deposit of bismuth containing alloy tenaciously adhered to a top surface and being alloyed with the tin-containing solder.

The present invention also relates to a composition comprising a bismuth compound, an organic diluent having a boiling point above 150° C., and an acid in a molar excess of the molar concentration of Bi ($3^+$) in the bath.

Another aspect of the present invention relates to an electronic package structure which comprises the tin-containing solder disclosed above.

The present invention is also concerned with a process for fabricating an electronic package which comprises forming an alloy of tin-bismuth containing solder by the process disclosed above.

Other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

DESCRIPTION OF BEST AND VARIOUS MODES FOR CARRYING OUT THE PRESENT INVENTION

In order to facilitate a further understanding of the present invention, a detailed discussion of immersing plating of bismuth as a preferred example is provided. However, it should be understood that the present invention is applicable to immersion plating of other metals. In particular, a number of other metal couples exist that possess low temperature eutectic points that lend themselves to similar processing. In any event, according to a preferred aspect of the present invention, bismuth is immersion plated onto a substrate and preferably onto a tin or tin-alloy solder.

The immersion plating—also referred to as exchange plating—of Bi on Sn and Sn alloys is thermodynamically favored, Bi being much more noble than Sn; it proceeds spontaneously when the tin alloy comes into contact with a Bi(3+)-containing solution. The exchange reaction is as follows:

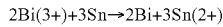

$$2Bi(3+)+3Sn \rightarrow 2Bi+3Sn(2+)$$

The immersion plating according to the present invention is carried out employing a bath comprising a bismuth compound and an organic diluent having a boiling point greater than 150° C. and an acid. The acid is typically present in a molar excess of the molar concentration of Bi (3+) in the bath. Preferably the plating is carried out above the eutectic temperature of the binary Sn—Bi system or Sn alloy-Bi system. The binary Sn—Bi eutectic is at 139° C. (and slightly lower when Cu and/or Ag are present). When Cu, Ag or other metals are initially are present in the solder, they are typically employed in amounts of at least about 0.5% and more typically about 0.8 to about 4%. Instead of poorly adherent dendritic crystallites as achieved in prior art, which are susceptible to being blown away when the sample is removed from the plating solution during routine rinsing and drying, droplets of liquid Sn—Bi eutectic are generated on the Sn alloy surface. These droplets have good adhesion to the surface and actually penetrate into the bulk tin alloy along grain boundaries. The Sn—Bi eutectic solidifies and stays in place when the sample is cooled down and rinsed. Reflowing the alloy, even in the absence of flux, results in a uniform composition across the solder ball. This is in stark contrast to Bi immersion—deposited at sub-eutectic temperature, which cannot be reflowed even with the aid of average fluxes.

The plating bath is typically at a temperature above the eutectic temperature of the alloy(s) to be generated by the plating reaction. The preferred operating temperature is 140 to about 150° C., which makes it difficult, if not impractical, to use an aqueous system. According to the present invention an organic diluent having a boiling point greater than 150° C. is employed. The organic diluent also preferably has the following characteristics: good solvent for bismuth and tin salts and for any complexant added to assist in their dissolution; compatibility with acid (since some acid is typically employed for keeping Bi and Sn salts in solution); boiling point in excess of 150° C. (e.g. relatively low vapor pressure at operating temperatures); flash point in excess of 150° C.; reasonable stability at 150° C.; and environmentally benign. However, diluents with lower flash points can be used by carrying out the process in the presence of an inert gas atmosphere such as nitrogen.

The preferred diluents are polyols such as glycols such as ethylene glycol and propylene glycol and glycerol with glycerol being the most preferred. Other suitable diluents include sulfolane, dimethyl sulfone, dimethyl sulfoxide and tetraglyme. Mixtures of diluents can be employed when desired.

Another class of suitable diluents are compounds known as ionic liquids. Examples include alkylpyridimium salts and dialkylimidazolium salts of fluorinated anions, e.g., 1-butyl-3-methylimidazolium tetrafluoroborate or 1-ethyl-3-methylimidazolium trifluoromethanesulfonate. These compounds have the advantage of negligible vapor pressure, chemical inertness, and thermal stability superior to that of most organic solvents. Accordingly, they can be used at temperatures of 200–250° C., especially for short periods of time.

Glycerol is a polar solvent with good dissolution capability for many salts; it boils at 290° C., has a vapor pressure of 1–2 torr in the 140–150° C. range, and a flash point of 160° C. Acidified glycerol solutions containing Bi salts can be kept at 140–150° C. for at least 4 days without substantial decomposition. Glycerol is classified by the US government as GRAS ("generally regarded as safe"), and is readily biodegradable. Glycerol in the presence of chloride or bromide ions is a good solvent for bismuth salts such as the nitrate or the 2-ethylhexanoate. This is significant because bismuth salts tend to have low to nil solubilities in most solvents.

The bismuth compound employed is typically a salt such as the nitrate, 2-ethylhexanoate, tetrafluoroborate and salts of sulfonic acids such as methanesulfonate and trifluoromethanesulfonate.

The amount of bismuth compound is typically about 0.001 M to about 0.02 M, and more typically about 0.003 to about 0.012 M.

The bath also includes an acid to help maintain the Bi(3+) in the solution and typically in a molar excess of the molar concentration of Bi (3+), more typically at least about 0.001 M and even more typically about 0.005 to about 0.02 M. Typical acids include methanesulfonic acid, hydrochloric acid, sulfuric acid, nitric acid, and hydrobromic acid.

The bath also preferably includes a complexant for the bismuth. Typical complexants are chloride and bromide salts such as potassium, ammonium and sodium. The complexant, when employed, is typically about 0.01 to about 0.5 M, and more typically about 0.02 to about 0.2 M.

The presence of a transient liquid phase also makes practical the codeposition with bismuth of additional elements, such as copper, that normally would generate poorly adherent deposits on tin. For example, a glycerol-soluble salt of the additional element, which has to be more electronegative than tin, can be added to the bismuth-plating composition for this purpose. The additional element is reduced by the tin and forms grains—of the pure element or of an intermetallic phase—that on cooling remain anchored to the surface by the freezing tin-bismuth eutectic. An inert gas atmosphere such as nitrogen can be used to prevent air oxidation of the additional element, especially if the latter is copper.

The bath can include other alloying metals such as copper and silver typically in the form of a salt such as nitrate or 2-ethylhexanoaate. The amount of such co-alloying material, when present, is typically in a molar ratio to Bi of about 1:10 to about 10:1, and more typically about 1:1 to about 6:1.

The alloys formed typically contain about 0.15 to about 0.2% bismuth. When present, the silver and copper are typically present in amounts in the alloy of at least about 0.5% and more typically about 0.8 to about 4%. When a Sn—Bi solder is desired as the final product, the alloys formed typically contain about 3% Bi.

The object or structure to be plated is preferably, but not necessarily, treated with an etchant composition to remove, for instance surface contaminants, if any, such as oxides. A typical etchant is methanesulfonic acid.

The Sn—Bi liquid allow is initially deposited as droplets that wet the solid tin-based surface well, provided that the oxide-removal step was effective. As a result, a macroscopically smooth surface is generated, with reflectivity similar to that of the original alloy. The surface coverage is incomplete for the short exposures (and/or low Bi(3+) concentrations) used to obtain low Bi contents of 0.15–0.6%. Thus, achieving reliable protection at these low Bi contents necessitates the reflow of the tin-based connector, which uniformly redistributes the bismuth throughout the volume—and the surface—of the connector. However, with longer exposure (and/or higher Bi(3+) concentration) essentially complete coverage of the surface can be achieved. Thus the method outlined above can be applied beyond solder balls and other tin-based connectors, to serve more generally for the protection and preservation of tin-based items or devices that are exposed to cold temperatures. Since the nucleation of the low temperature phase is a surface-dependent process, coverage of the surface with a thin layer of Sn—Bi alloy effectively prevents the transformation without requiring the reflow (or remelting) of the item, which would be undesirable for, e.g. ornamental or museum artifacts.

In addition, after the structure is removed from the plating bath, it can be rinsed with a suitable fluid to remove any residual plating composition. Also, the structure can be dried and, if desired, reflowed to assure that the elements are redistributed uniformly throughout the volume of the structure, e.g. the connector.

A typical electronic structure employing the solder of the present invention includes a first electronic component having a conductive pad, a second electronic component having a conductive pad, and the solder interconnect structure which solderably couples the first electronic component to the second electronic component. The first electronic component may include, inter alia, a first circuitized substrate such as chip carrier. The second electronic component may include, inter alia, a second circuitized substrate such as a circuit card.

The following non-limiting examples are presented to further illustrate the present invention.

EXAMPLE 1

A sample containing plated Sn—~0.5% Cu solder balls was dipped for 1 minute in stirred 66% methanesulfonic acid to remove passivating oxide layer. It was then rinsed briefly with water followed by ethanol, and blow-dried. It was then dipped for 30 seconds into stirred aliquot of solution containing 6.16 g (0.012 M) bismuth 2-ethylhexanoate; 20 g potassium bromide (Bi complexant); 2 ml methanesulfonic acid (99%); and 1000 g glycerol and kept at a temperature of about 142±3° C.

The structure was then rinsed with water, ethanol, and blow-dried. C4 balls kept their bright appearance. Analysis showed a content of about 0.6% Bi after plating. Cross-sectioning before and after reflow showed that the Bi concentrated initially at and near the ball surface but redistributed itself uniformly throughout the solder ball after a fluxless reflow. The fluxless feature is important, because it increases manufacturing flexibility; it proves that the Bi alloy generated is low in oxide.

When the same conditions were employed but at a slightly lower temperature of 125–130° C., the resulting Bi deposit was dark, powdery and poorly adherent, demonstrating the importance of operating above the eutectic temperature.

Moreover, to get lower Bi concentrations one merely uses lower Bi(3+) concentrations and/or a shorter dip, e.g. a 30 second dip in a 0.003 M bismuth 2-ethylhexanoate for a content of about 0.15% Bi.

The Bi plating of the present invention lends itself readily to generating Sn-based connectors with much higher content of Bi than the small amounts needed for protection against low temperature transformation. The amount of bismuth deposited is approximately proportional to the deposition time and to the Bi(3+) concentration. Thus, under the same conditions described above in Example 1, an average content of 3% Bi after reflow was obtained when the deposition time was extended to 3 minutes. This is a typical concentration for a SnBi lead-free alloy. Of course, higher Bi contents are obtainable at longer dip times and/or higher Bi(3+) concentrations. This option can be useful for generating connectors with melting points substantially below that of tin. It can also be used for connectors or plugs that can be easily reshaped by mild pressure while hot, since at higher Bi content the Bi-rich low melting phase tends to infiltrate the intergranular space between the tin-rich grains, thus facilitating slippage of the tin-rich grains against each other.

The immersion plating of a liquid Sn—Bi eutectic as described above and as stated is merely exemplary of the patent invention. There are other metal couples possessing low temperature eutectic points that lend themselves to a similar treatment. In all these cases, a surface of a less noble second metal is treated with a hot solution of a compound of a more noble first metal, at a temperature high enough to ensure that the deposited metal will spontaneously generate a liquid alloy but low enough that the bulk second metal will not melt. The same considerations described above for the choice of diluent apply, modified for the particular range of temperature. For instance, a precleaned zinc surface can be coated with a Sn—Zn eutectic (m.p. 198.5° C.) by using solution of an Sn(2+) salt in an ionic liquid, or in a high-boiling coordinating organic diluent (e.g., tetraglyme) under nitrogen, at 200° C. or higher. In this example, Sn is the first metal and zinc is the second metal of the general case. The Sn—Zn alloy coating is useful in that it makes the Zn surface less susceptible to corrosion and more solderable. Additional metal alloys that can be generated similarly at temperatures below 200° C. are, e.g., Bi—Cd, Bi—In, In—Zn, Sn—Cd, and In—Cd; a person skilled in the art, once aware of this disclosure, can readily find additional examples, especially when higher deposition temperatures are included.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concepts as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with various modifications required by the particular applications or uses of the invention. Accordingly, the description is not intended to limit the invention to the form disclosed herein. Also, it is intended that the appended claims be construed to include alternative embodiments.

What is claimed as new and desired to be protected by Letters Patent of the United States is:

1. A process for plating a first metal onto a substrate which comprises a second and different metal that is more electropositive than the first metal, which comprises immersing said substrate into a bath comprising a compound of said first metal and an organic diluent having a boiling point higher than an eutectic point in a phase diagram of the first and second metals; and
   wherein the bath is at a temperature above said eutectic point but below the melting point of said second metal.

2. The process of claim 1, wherein the diluent is selected from the group consisting of polyols, sulfonate, dimethyl sulfoxide and tetraglyme and mixtures thereof.

3. The process of claim 1, wherein the diluent is an ionic liquid.

4. The process of claim 3, wherein said ionic liquid comprises an alkylpyridinium salt or dialkylimidazolium salt.

5. The method of claim 1, wherein said first metal is selected from the group consisting of tin, bismuth, indium, and said second and different metal is selected from the group consisting of zinc, cadmium, and indium.

6. The method of claim 1, wherein said first metal comprises tin and said second metal comprises zinc.

7. The method of claim 6, wherein the dilueut comprise an ionic liquid or tetraglyme and the immersing is carried out under nitrogen.

8. A process for plating bismuth onto a substrate which comprises immersing the substrate to be coated into a bath comprising a bismuth compound, an organic diluent having a boiling point greater than 150° C. and an acid, and wherein the bath is above the eutectic temperature of an alloy to be formed from reaction of the bismuth with the substrate.

9. The process of claim 8, wherein the diluent has a flash point above 150° C.

10. The process of claim 8, wherein the diluent is selected from the group consisting of polyols, sulfolane, dimethyl sulfone, dimethyl sulfoxide and tetraglyme and mixtures thereof.

11. The process of claim 8, wherein the diluent is an ionic liquid.

12. The process of claim 8, wherein said ionic liquid comprises an alkylpyridinium salt or dialkylimidazolium salt.

13. The process of claim 8, wherein the diluent comprises a glycol or a polyol.

14. The process of claim 8, wherein the diluent comprises glycerol.

15. The process of claim 8, wherein the bath is at a temperature of at least 140° C. during the immersion.

16. The process of claim 8, wherein the bath is at a temperature of 140° C. to about 150° C. during the immersion.

17. The process of claim 8, wherein the bath contains a molar concentration of acid in excess of the molar concentration of Bi (3+).

18. The process of claim 8, wherein the bismuth compound comprises a bismuth salt of at least one member selected from the group consisting of nitric, 2-ethylhexanoic, tetrafluoroboric and sulfonic acids.

19. The process of claim 8, wherein the bath further comprises a bismuth complexant.

20. The process of claim 19 wherein the complexant comprises a chloride or bromide.

21. The process of claim 20, which further comprises reflowing to form an alloy of the tin containing solder an bismuth.

22. The process of claim 21, wherein said alloy comprises about 0.1 to about 3% by weight of bismuth after said reflowing.

23. The process of claim 21, wherein said alloy comprises about 0.1 to about 0.2% by weight of bismuth after said reflowing.

24. A process for fabricating an electronic package which comprises forming an alloy of tin-containing solder and bismuth according to claim 21.

25. The process of claim 8, wherein the substrate is a tin containing solder.

26. The process of claim 8, wherein said bath comprises bismuth 2-ethylexanoate potassium bromide, methanesulfonic acid and glycerol.

27. The process of claim 8, which further comprises pretreating the substrate with an etchant prior to the immersing.

28. The process of claim 27, wherein the etchant comprises methanesulfonic acid.

29. The process of claim 8, which further comprises removing the substrate from the bath and then rinsing and drying the substrate.

30. The process of claim 29 which further comprises, after said drying, reflowing to form said alloy.

31. The process of claim 30 wherein said reflowing is carried out without flux.

32. A composition consisting essentially of a bismuth compound, an organic diluent having a boiling point about 150° C., and having an acid pH.

33. The composition of claim 32, wherein the diluent has a flash point above 150° C.

34. The composition of claim 32, wherein the diluent comprises a glycol or a polyol.

35. The composition of claim 32, wherein the diluent comprises glycerol.

36. The composition of claim 32, wherein the acid concentration is at least about 0.001 M.

37. The composition of claim 32, wherein the acid concentration is about 0.005 to about 0.02 M.

38. The composition of claim 32, wherein further comprises a bismuth complexant.

39. The composition of claim 38 wherein said complexant comprises a chloride or bromide.

40. The composition of claim 32, which comprises bismuth 2-ethylhexanoate, potassium bromide, methanesulfonic acid and glycerol.

41. The composition of claim 32 being a non-aqueous composition.

* * * * *